(12) United States Patent
Rabinowitz

(10) Patent No.: US 7,960,641 B2
(45) Date of Patent: *Jun. 14, 2011

(54) TRACKING AND FOCUSING ADJUSTABLE FRESNEL LENS ARRAY SOLAR CONCENTRATOR

(76) Inventor: Mario Rabinowitz, Redwood City, CA (US)

(*) Notice: Subject to any disclaimer, the term of this patent is extended or adjusted under 35 U.S.C. 154(b) by 650 days.

This patent is subject to a terminal disclaimer.

(21) Appl. No.: 12/022,993

(22) Filed: Jan. 30, 2008

(65) Prior Publication Data

US 2009/0188545 A1 Jul. 30, 2009

(51) Int. Cl.
*H02N 6/00* (2006.01)
*F24J 2/00* (2006.01)
(52) U.S. Cl. .................................. 136/246; 126/698
(58) Field of Classification Search .................. 136/246, 136/259; 126/573, 600, 698–700
See application file for complete search history.

(56) References Cited

U.S. PATENT DOCUMENTS

| | | | |
|---|---|---|---|
| 4,848,319 A | 7/1989 | Appeldom | |
| 5,151,826 A | 9/1992 | Pasco | |
| 5,917,646 A * | 6/1999 | Sheridon | 359/296 |
| 5,941,239 A * | 8/1999 | Rogers | 126/698 |
| 6,020,554 A | 2/2000 | Kaminar et al. | |
| 6,399,874 B1 | 6/2002 | Olah | |
| 6,612,705 B1 | 9/2003 | Davidson et al. | |
| 6,698,693 B2 | 3/2004 | Rabinowitz et al. | |
| 6,700,055 B2 | 3/2004 | Barone | |
| 6,738,176 B2 | 5/2004 | Rabinowitz et al. | |
| 6,843,573 B2 | 1/2005 | Rabinowitz et al. | |
| 6,957,894 B2 | 10/2005 | Rabinowitz et al. | |
| 6,964,486 B2 | 11/2005 | Rabinowitz | |
| 6,975,445 B1 | 12/2005 | Rabinowitz | |
| 6,988,809 B2 | 1/2006 | Rabinowitz | |
| 7,077,361 B1 | 7/2006 | Rabinowitz | |
| 7,130,102 B2 | 10/2006 | Rabinowitz | |
| 7,133,183 B2 | 11/2006 | Rabinowitz | |
| 7,187,490 B2 | 3/2007 | Rabinowitz | |
| 7,206,142 B1 | 4/2007 | Wagner | |
| 7,247,790 B2 | 7/2007 | Rabinowitz | |
| 2004/0021964 A1 * | 2/2004 | Rabinowitz et al. | 359/853 |
| 2005/0195465 A1 * | 9/2005 | Rabinowitz | 359/291 |
| 2006/0150968 A1 * | 7/2006 | Rabinowitz | 126/714 |
| 2007/0251569 A1 * | 11/2007 | Shan et al. | 136/246 |
| 2008/0178867 A1 * | 7/2008 | DiDomenico | 126/573 |

FOREIGN PATENT DOCUMENTS

WO PCT/US02/20199 6/2002

* cited by examiner

*Primary Examiner* — Jessica L Ward
*Assistant Examiner* — Jacky Yuen

(57) ABSTRACT

This invention deals with novel method and apparatus for positioning and motion control of the elements (lenses) of a Fresnel lens solar concentrator tracking array by induced and/or permanent dipole coupling to an electronic grid to produce angular deflection, and rotational motion. Thus forces and torques are produced without the use of internal moving parts. Control can be achieved without recourse to magnetic fields, by means of high electric fields which may be attained at relatively low voltages. At low voltages, the instant invention exceeds the capability of conventional systems. It can perform dynamic motion control with independent amplitude and frequency modulation. It is ideally suited for maximization of solar energy focused by the array onto a receiver. Since there are no mechanical likages, the instant invention is the most adapted for fabrication from the mini- to the micro-technology realm. Furthermore it provides less costly and greater ease of manufacture from the mini-to the micro-realm.

16 Claims, 5 Drawing Sheets

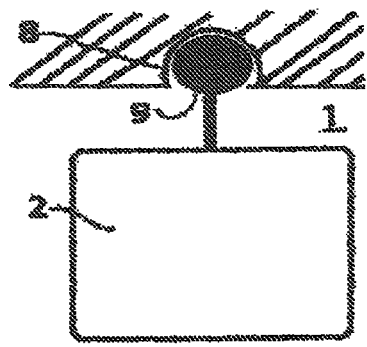
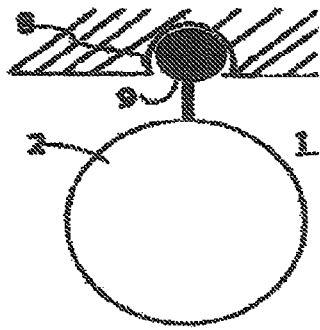
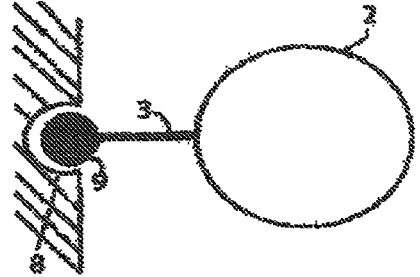
Fig. 1A    Fig. 1B    Fig. 1C
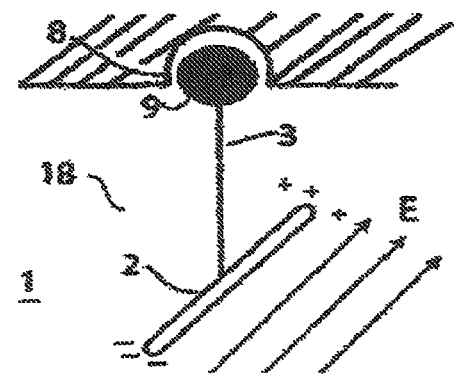
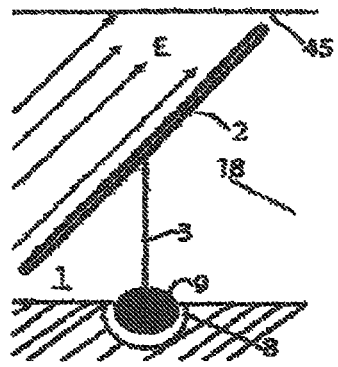
Fig. 2A    Fig. 2B
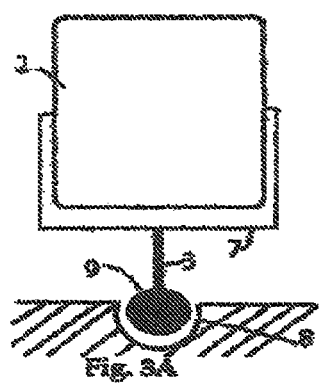
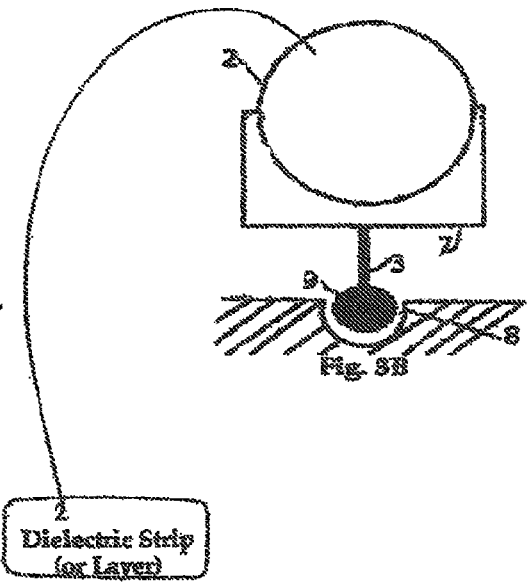
Fig. 3A    Fig. 3B

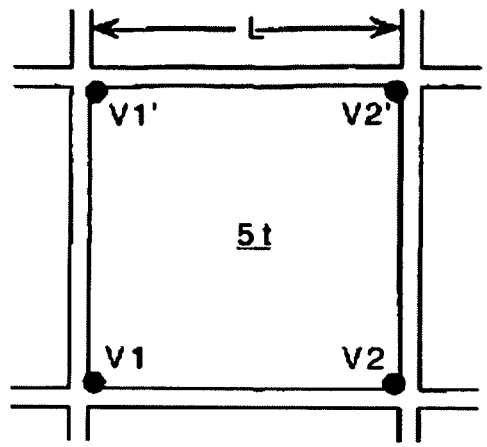
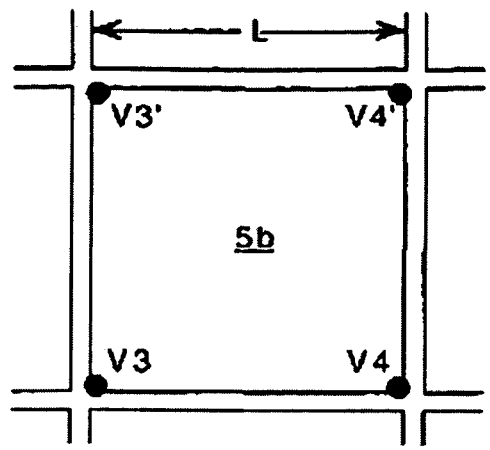
Fig. 6A                Fig. 6B
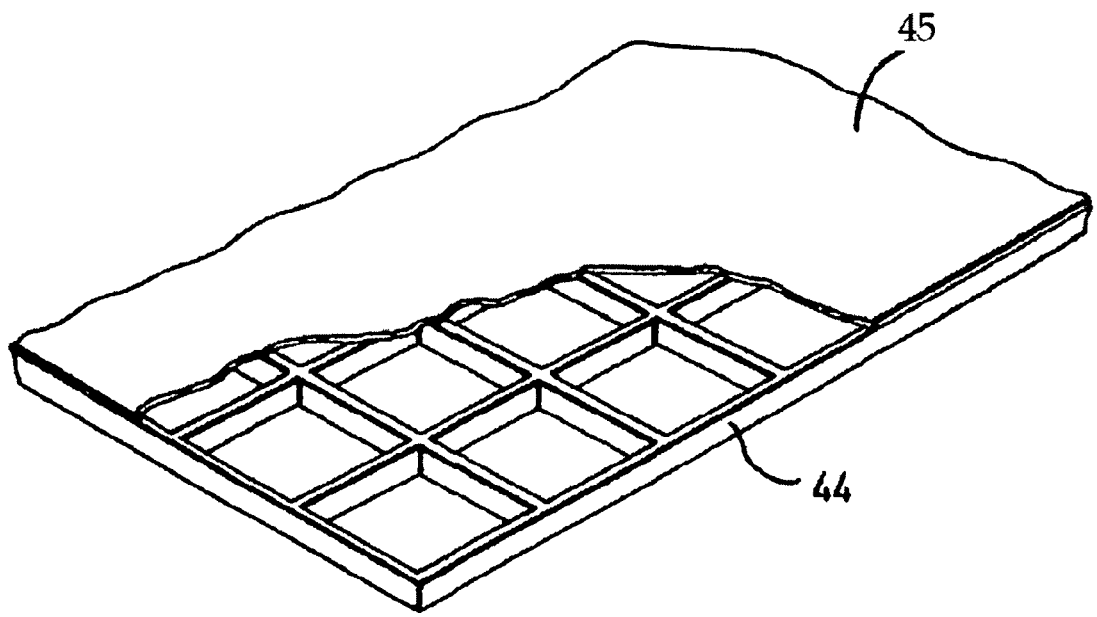
Fig. 6C $V_{00}$   $V_{01}$   $V_{02}$   ...

TRACKING AND FOCUSING ADJUSTABLE FRESNEL LENS ARRAY SOLAR CONCENTRATOR

FIELD OF THE INVENTION

The instant invention relates generally to a Solar Energy Concentrator array of pivoted lenses that function as a Fresnel lens to track and focus the sun by means of permanent and/or induced electric dipole alignment. The electric dipole interaction provides an alignment linkage for the lenses which are on universal pivots that can rotate or tilt in any direction; or on gimbal pivots.

BACKGROUND OF THE INVENTION

This invention provides a better means to achieve affordable solar energy than by conventional means. In the latter, moving one or more monolithic Fresnel lenses generally requires motors and gears that consume a great deal of power. This results in an expensive, bulky, and ponderous system. The present invention functions in solar concentrators and similar equipment much the same as an ordinary lens that concentrates to a small confined two dimensional-like region, or a one dimensional-like thin rectangle, without the disadvantages of bulk and weight associated with conventional tracking apparatus.

The angular alignment of the optical elements (lenses etc.) is accomplished by means of permanent and/or induced dipole alignment of the pivoted lenses rather than with cumbersome motors. Induced dipole alignment of rotatable optical elements is described and taught in detail in U.S. Pat. No. 7,187,490, "Induced Dipole Alignment Of Solar Concentrator Balls" by Mario Rabinowitz, issued on Mar. 6, 2007. It may also be helpful to see U.S. Pat. No. 6,964,486, "Alignment of Solar Concentrator Micro-Mirrors" by Mario Rabinowitz, issued on Nov. 15, 2005.

DESCRIPTION OF THE PRIOR ART

No prior art was found related to induced dipole alignment in electric fields of pivoted lenses serving as elements of a Fresnel lens solar concentrator. The prior art has investigated mirrored ball alignment where the balls are confined in concentric cavities; and mirrored ball alignment where the balls are confined between two egg crate like sheets. No prior art was found that utilized induced dipole alignment in electric fields of pivoted lenses in a Fresnel lens solar concentrator, light concentrators, or other similar equipment. The pivoted structure of the instant invention permits operation without confinement, and if desired operation in air.

INCORPORATION BY REFERENCE

In a solar energy application (as well as other applications), adjustable reflecting elements are an important feature of a Fresnel lens solar concentrator that tracks the sun and directs the sunlight to a receiver as described in the following patents and published papers. The following U.S. patents, and Solar Journal publication related to a "reflecting solar concentrator" are fully incorporated herein by reference.

1. U.S. Pat. No. 7,247,790 by Mario Rabinowitz, "Spinning Concentrator Enhanced Solar Energy Alternating Current Production" issued on Jul. 24, 2007.
2. U.S. Pat. No. 7,187,490 by Mario Rabinowitz, "Induced Dipole Alignment Of Solar Concentrator Balls" issued on Mar. 6, 2007
3. U.S. Pat. No. 7,133,183 by Mario Rabinowitz, "Micro-Optics Solar Energy Concentrator" issued on Nov. 7, 2006.
4. U.S. Pat. No. 7,130,102 by Mario Rabinowitz, "Dynamic Reflection, Illumination, and Projection" issued on Oct. 31, 2006.
5. U.S. Pat. No. 7,115,881 by Mario Rabinowitz and Mark Davidson, "Positioning and Motion Control by Electrons, Ions, and Neutrals in Electric Fields" issued on Oct. 3, 2006.
6. U.S. Pat. No. 7,112,253, by Mario Rabinowitz, "Manufacturing Transparent Lensed Mini-Balls for Solar Energy Concentration and Analogous Applications" issued on Sep. 26, 2006.
7. U.S. Pat. No. 7,077,361, by Mario Rabinowitz, "Micro-Optics Concentrator for Solar Power Satellites" issued on Jul. 18, 2006.
8. U.S. Pat. No. 6,988,809 by Mario Rabinowitz, "Advanced Micro-Optics Solar Energy Collection System" issued on Jan. 24, 2006.
9. U.S. Pat. No. 6,987,604 by Mario Rabinowitz and David Overhauser, "Manufacture of and Apparatus for Nearly Frictionless Operation of a Rotatable Array of Micro-Lenss in a Solar Concentrator Sheet" issued on Jan. 17, 2006.
10. U.S. Pat. No. 6,975,445 by Mario Rabinowitz, "Dynamic Optical Switching Ensemble" issued on Dec. 13, 2005.
11. U.S. Pat. No. 6,964,486 by Mario Rabinowitz, "Alignment of Solar Concentrator Micro-Lenss" issued on Nov. 15, 2005.
12. U.S. Pat. No. 6,957,894 by Mario Rabinowitz and Felipe Garcia, "Group Alignment Of Solar Concentrator Micro-Lenss" issued on Oct. 25, 2005.
13. U.S. Pat. No. 6,843,573 by Mario Rabinowitz and Mark Davidson, "Mini-Optics Solar Energy Concentrator" issued on Jan. 18, 2005.
14. U.S. Pat. No. 6,738,176 by Mario Rabinowitz and Mark Davidson, "Dynamic Multi- Wavelength Switching Ensemble" issued on May 18, 2004.
15. U.S. Pat. No. 6,698,693 by Mark Davidson and Mario Rabinowitz, "Solar Propulsion Assist" issued on Mar. 2, 2004.
16. U.S. Pat. No. 6,612,705 by Mark Davidson and Mario Rabinowitz, "Mini-Optics Solar Energy Concentrator" issued on Sep. 2, 2003.
17. Solar Energy Journal, Vol. 77, Issue #1, 3-13 (2004) "Electronic film with embedded micro-mirrors for solar energy concentrator systems" by Mario Rabinowitz and Mark Davidson.

DEFINITIONS

"Adjustable Fresnel lens" is a variable tracking and focusing ensemble of planar lenses much like a planar Fresnel lens is a focusing transmitting surface. Heuristically, it can somewhat be thought of as the projection of thin variable-angular segments of small portions of a thick focusing lens upon a planar surface whose angles can be adjusted with respect to the planar surface.

"Concentrator" as used herein in general is an adjustable array of lenses for tracking a light source and focusing its light. In a solar energy context, it is that part of a Solar Collector system that directs and concentrates solar radiation onto a solar Receiver.

"Dielectric" refers to an insulating material in which an electric field can be sustained with a minimum power dissipation.

"Dielectric Constant" is the relative static permittivity (or static relative permittivity) of a material as a measure of the extent to which it concentrates electrostatic lines of flux. It is the ratio of the amount of stored electrical energy when an electric field is applied, relative to the permittivity of a vacuum.

"Electric dipole" refers to the polarization of negative and positive charge. This may be permanent as with electrets, or induced.

"Electric field" or "electric stress" refers to a voltage gradient. An electric field can produce a force on charged objects, as well as neutral objects. The force on neutral objects results from an interaction of the electric field on permanent or induced electric polar moments in the object.

"Electrical breakdown" occurs when a high enough voltage or electric field is applied to a dielectric (vacuum, gas, liquid, or solid) at which substantial electric charge is caused to move through the dielectric.

"Electret" refers to a solid dielectric possessing permanent i.e. persistent electric polarization, by virtue of a long time constant for decay of charge separation.

"Focusing planar lens" is a thin almost planar lens constructed with stepped varying angles so as to have the optical properties of a much thicker convex (or concave) lens. It can heuristically be thought of somewhat as the projection of thin equi-angular segments of small portions of a thick lens upon a planar surface. It is a focusing planar reflecting surface much like a planar Fresnel lens is a focusing transmitting surface.

"Gimbals are a two or more axis mount consisting of two or more rings mounted on axes at right angles to each other. An object mounted on a three ring gimbal can remain horizontally suspended on a plane between the rings regardless as to the stability of the base.

"Gimbal lock" occurs when two axes of rotation line up, depriving the availability of the other degree of freedom of rotation.

"Induced Electric dipole" refers to the polarization of negative and positive charge produced by the application of an electric field.

"Internal-swivel" herein means the ability to rotate in place without the need for an external affixed pivot or swivel. In the instant invention, planar mirror disks, etc. internal-swivel inside hollow concentric cavities when acted on by an external field to cause rotatation (e.g. to track the sun).

"Macroscopic electric field" is the applied electric field on the basis of the imposed voltage and the gross (macroscopic) geometry of the electrodes, and which is relevant as long as one is not too near the electrodes.

"Optical elements" are the lenses, focusers, etc. of a concentrator array. As a focuser the optical element may be a mini-lens or include a mini-lens.

"Torr" is a unit of pressure, where atmospheric pressure of 14.7 lb/in$^2$=760 Torr=760 mm of Hg.

"Receiver" as used herein in general such as a solar cell or heat engine system for receiving reflected light. In a solar energy context, it receives concentrated solar radiation from the adjustable lens assembly for the conversion of solar energy into more conveniently usable energy such as electricity.

"Swivel" is a pivot or universal joint permitting many degrees of freedom for rotation about the swivel point. As taught in the instant invention, a preferred embodiment is to have the mirrors suspended below the swivel.

SUMMARY OF THE INVENTION

In order for any solar concentrator to operate efficiently, it is necessary for it to track the sun across the sky on a daily basis, so that the lens(es) always point in the direction of the sun. In the instant invention, electric dipole linkage of each lens to a control grid accomplishes both tracking of the sun, and focusing to a receiver as described in detail herein.

The dielectric material of optical elements such as lenses are polarizable in an applied electrostatic field, E, so that a dipole moment is induced in the dielectric material of the lenses because the charge distributes itself so as to diminish the electric field inside it. To internally reduce the applied field E, the lens material polarizes antiparallel to the direction of E, making positive the end that is parallel to the direction of E, and the other end negative. An induced electrostatic dipole in a pivoted conductor in an electrostatic field is somewhat analogous to an induced magnetic dipole in a pivoted ferromagnetic material in a magnetic field, which effect most people have experienced. When pivoted, a high aspect ratio (length to diameter ratio) ferromagnetic material rotates to align itself parallel to an external magnetic field. In a dielectric, an external applied electric field E induces a dipole by polarizing the dielectric to partially cancel the field E inside it. Similarly an electrostatic field polarizes and aligns each dielectric lens. Furthermore, a permanent electret dipole can be incorporated in each lens to further enhance the dipole field that interacts with the addressable alignment electric field.

Thus the instant invention provides an increased force positioning system by means of high dielectric materials, to overcome friction and to allow for the use of lower positioning electric fields. The permittivity (directly related to dielectric constant) of the dielectric material is analogous to the permeability of a ferromagnetic material. The higher both are, the larger the induced dipole in the corresponding field and the larger the rotational torque which is the vector product of the net dipole moment and the applied field. A high dielectric constant material of low mass density is preferred as there is a volume aspect to the torque that tends to cancel the volume of the material leaving the angular acceleration approximately proportional to the density of the rotated element. For those materials that are transparent, the dielectric constant is approximately equal to the square of the index of refraction.

The following Table of High Dielectric Constant Materials indicates a wide range of materials from which suitable transparent materials can be used. Even non-transparent materials of high dielectric constant can be incorporated as thin strips of a lens to aid in alignment, while blocking only a small fraction of the incident light. Highly polarizable material in the context of the instant invention can be any of the materials listed below, and preferably has a dielectric constant greater than 4. Since the index of refraction, n, is approximately equal to the square root of the dielectric constant, n is preferably greater than 2. Liquids are included as they could easily be encapsulated and generally are of low density.

Table of High Dielectric Constant Materials

| Dielectric | Dielectric Constant |
| --- | --- |
| Glass | 3.7-10 |
| Electroactive Polymers | 2-12 |
| Diamond | 5.5-10 |
| Methanol | 30 |
| Furfural | 42 |
| Glycerol | 47-68 |
| Water | 34-88 |
| Formamide | 84 |
| Strontium Titanate | 310 |
| Barium Strontium Titanate | 15-500 |
| Polymer Composites | >1000 |

-continued

Table of High Dielectric Constant Materials

| Dielectric | Dielectric Constant |
|---|---|
| (La,Nb):(Zr,Ti)PbO$_3$ | 500-6000 |
| Barium Titanate | 90-10,000 |
| Conjugated Polymers | 6-100,000 |

It is relevant to consider the dipole interactions between lenses. A heuristic analysis shows that this is not a serious problem. The electric field strength of a dipole, $E_d$ is proportional to $1/r^3$, where r is the radial distance from the center of the dipole. The energy in the field is proportianal to $(E_d)^2$. Thus the energy of a dipole field varies as $1/r^6$. The force is proportional to the gradient of the field, and hence varies as $1/r^7$. With such a rapid fall off of the dipole interaction force, it can generally be made very small compared to the force due to the applied field E, and to the frictional forces that are normally present. Therefore interaction of the dipole field forces between lenses, can generally be made negligible.

Although the primary application of the instant invention is for a solar concentrator application, there are a number of other applications such as lensed light concentration, illumination and projection, solar propulsion assist, etc.

In the adjustable Fresnel lenss solar concentrator with induced dipole alignment of pivoted lenss that has been developed, the induced dipole aligns the optical elements to concentrate solar energy on a receiver having dimensions small compared to the dimensions of the array. This permits the focal point of the array to remain focused on the receiver over the course of a day and throughout the year.

Receivers, such as photovoltaic cells, convert the solar energy focused and delivered to them by the solar concentrator directly into electrical energy or via heat engines (e.g. Stirling cycle engines) which convert the solar energy into mechanical energy which can be used directly, or indirectly converted to electricity.

There are many aspects and applications of this invention, which provides techniques applicable individually or in combination for positioning of the optical elements of a solar concentrator, lensed light concentration, illumination and projection, solar propulsion assist, and similar equipment. The broad general concept of this invention relates to the actuation, motion production and control, and positioning resulting from a permanent and/or induced dipole interaction of pivoted lenses in electric fields by an electronic control grid. The instant invention can perform dynamic motion control over a wide range of dimensions from nanometers to centimeters, i.e. from the nano-range, through the micro-range, through the mini-range to the macro-range in a broad scope of applications in micro-electro-mechanical systems (MEMS) such as a solar concentrator, and in similar equipment such as optical switching to macro-positioning. Motorless linear motion, angular deflection, and continuous rotation are achieved without recourse to magnetic fields thus eliminating the need for coils. Furthermore, the instant invention permits less costly and greater ease of manufacture while providing well-defined motion and position control.

It is a general aspect of this invention to provide a dynamic system for motion control of an optical system.

Another general aspect of this invention provides a positioning system for an optical system.

Another aspect of this invention provides an actuator for an optical system.

Another aspect of this invention is to provide the motive force for an optical system.

Another aspect of the instant invention is to produce motorless motion of the elements of a solar concentrator.

Another aspect of this invention is to cause motorless angular deflection of the elements of a solar concentrator.

An aspect of the invention is to produce motorless continuous rotation of the elements of a solar concentrator.

An aspect of this invention is to produce motorless rotation with the ability to stop, of the elements of a solar concentrator.

Other aspects and advantages of the invention will be apparent in a description of specific embodiments thereof, given by way of example only, to enable one skilled in the art to readily practice the invention singly or in combination as described hereinafter with reference to the accompanying drawings. In the detailed drawings, like reference numerals indicate like components.

BRIEF DESCRIPTION OF THE DRAWINGS

FIG. 1A is a front cross-sectional view of a rectangular lens, hanging from a top universal pivot, that is one optical element of an adjustable Fresnel lens concentrator.

FIG. 1B is a front cross-sectional view of a circular lens, hanging from a top universal pivot, that is one optical element of an adjustable Fresnel lens concentrator.

FIG. 1C is a front cross-sectional view of a circular lens, supported by a side universal pivot, that is one optical element of an adjustable Fresnel lens concentrator.

FIG. 2A is a cross-sectional side view of a lens suspended from a top universal swivel, that is one optical element of an adjustable Fresnel lens concentrator.

FIG. 2B is a cross-sectional side view of a lens supported by a bottom universal swivel, that is one optical element of an adjustable Fresnel lens concentrator. The lens is immersed in a fluid, and has been polarized and aligned by the applied electric field E.

FIG. 3A is a front cross-sectional view of a gimbaled rectangular lens that is one optical element of an adjustable Fresnel lens concentrator.

FIG. 3B is a front cross-sectional view of a gimbaled circular lens that is one optical element of an adjustable Fresnel lens concentrator.

FIG. 6A is a schematic top view of an array of partitioned highly resistive electrodes showing in detail a top electrode of an electronic control grid for rotating the reflecting elements of a solar concentrator or other similar optical equipment.

This schematic can represent either passive or active addressing as will be explained in the detailed description.

FIG. 6B represents a bottom view of an array of partitioned highly resistive electrodes showing in detail a view of a bottom electrode and the voltages at its four corners.

FIG. 6C is a cut-away perspective of a schematic control grid showing a transparent sheet on top of the grid.

Figure 6D:
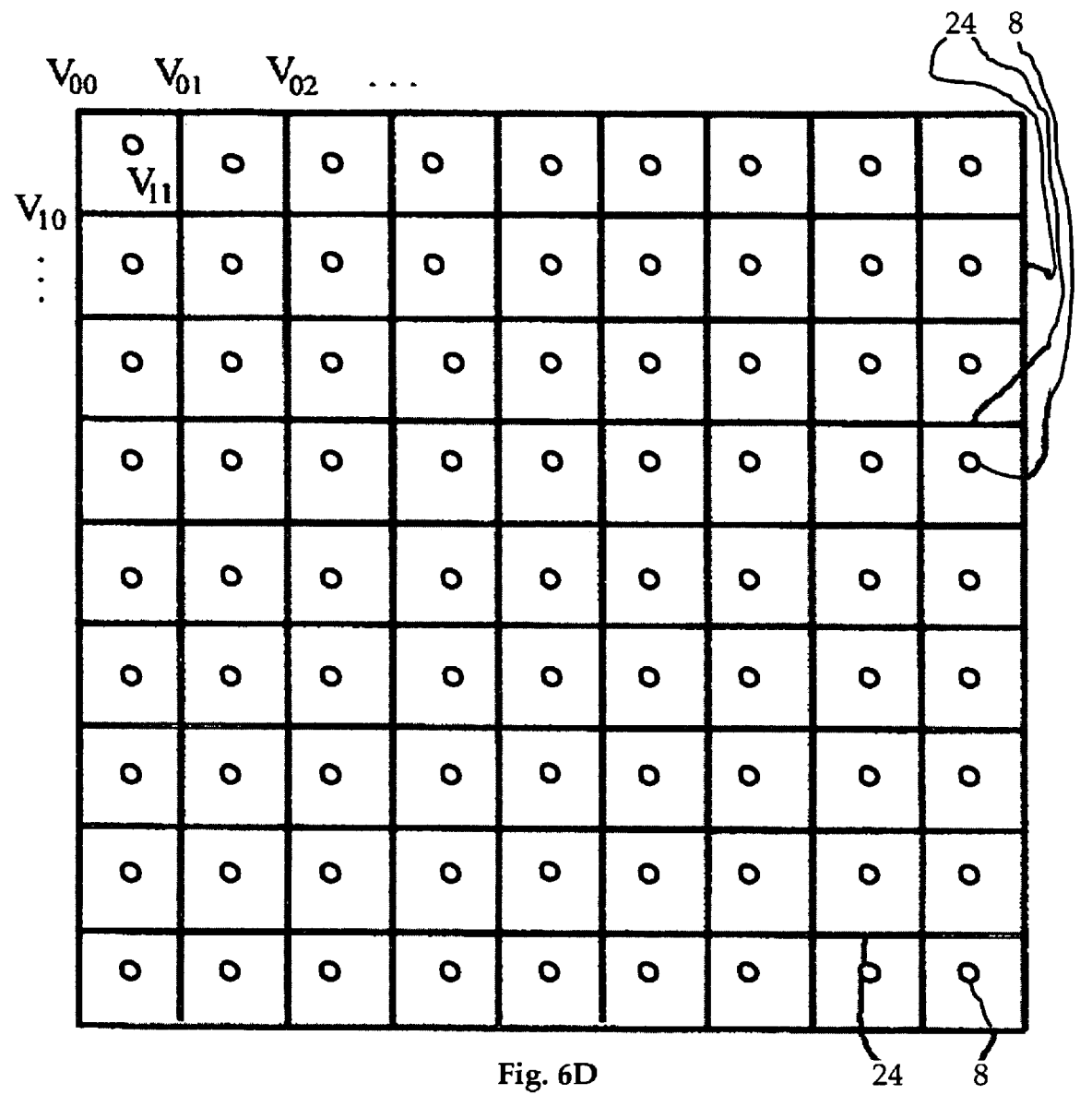

FIG. 6D is a schematic top view showing a generic electronic control grid that may represent a number of different kinds of transistorless grids; or grids with transistors at junctions, for matrix addressing and alignment of the optical elements of a solar concentrator or other similar optical equipment. Also shown schematically are the swivel bearings of the material that supports the lenses and the grid. This schematic can represent either passive or active addressing as will be explained in the detailed description.

Figure 7:
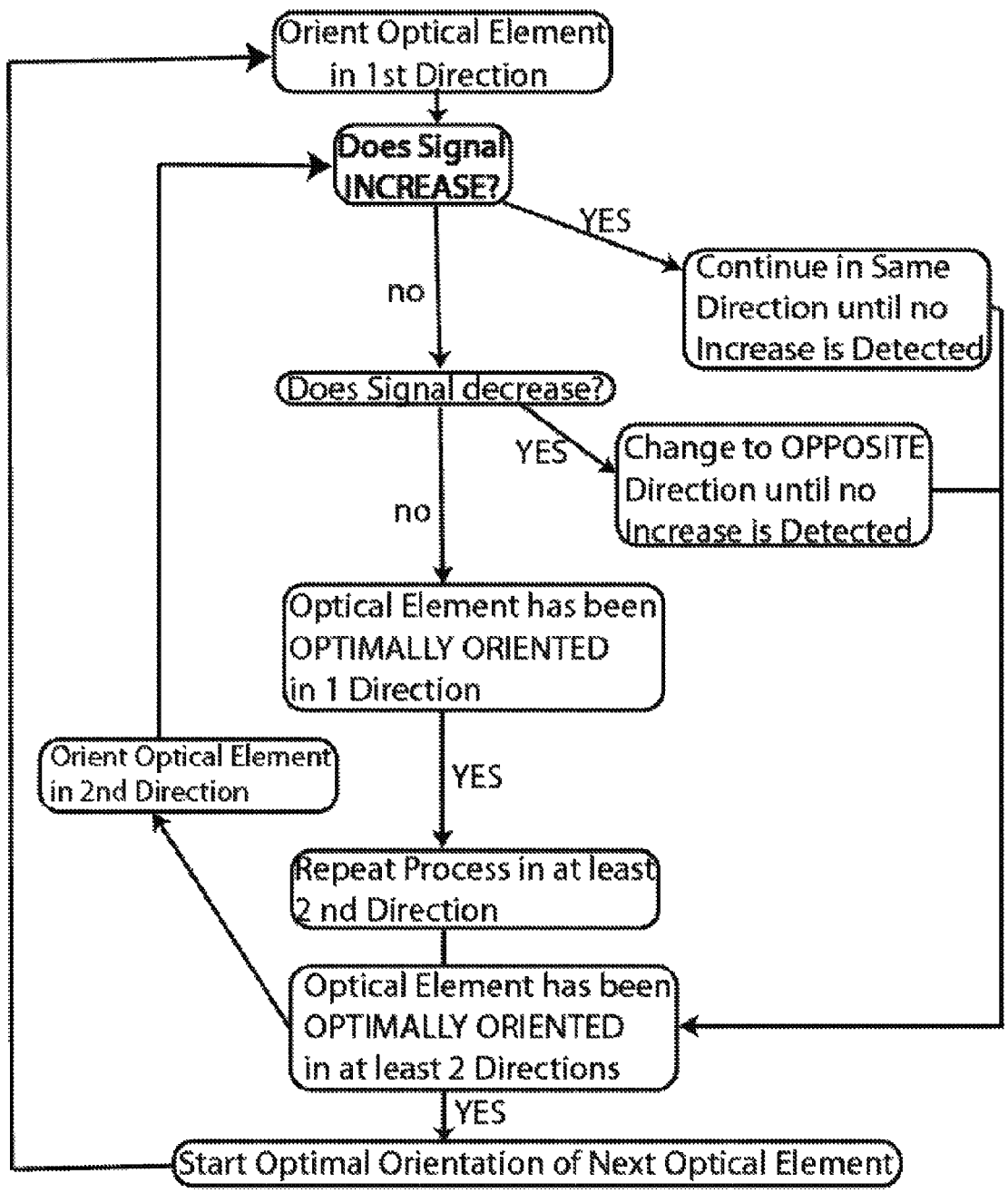

FIG. 7 is a block diagram flow chart summarizing a method in which a positive feedback system can optimize the tracking and focusing of the solar lens concentrator array.

GLOSSARY

The following is a glossary of components and structural members as referenced and employed in the instant invention with like reference alphanumerics indicating like components:
1—rotatable optical element(s) (such as a lens and its paraphernalia)
2—rotatable mini-lens
3—stem (supporting rod between lens and universal pivot)
5t—top of a grid compartment
5b—bottom of a grid compartment
7—gimbal pivots with 2 axes of rotation
8—swivel support bearing (holds swivel or pivot)
9—universal pivot (swivel) that can rotate or tilt in any direction
16—receiver (receives or collects light e.g. solar cell, Stirling cycle heat engine)
17—sheet (contains optical elements within it)
18—transparent lubricating dielectric fluid
19—concentric cavity
24—resistive grid wires
44—electronic control grid (in perspective)
45—transparent sheet on top of grid
E—electric field
V—voltage (number next to V indicates voltage location)
+—positive charge
−—negative charge

DETAILED DESCRIPTION OF THE PRESENTLY PREFERRED EMBODIMENTS

As is described here in detail, the objectives of the instant invention may be accomplished by any of a number of ways separately or in combination, as taught by the instant invention. A tracking solar concentrator has been developed in which the orientation of individual optical elements (lenses) is accomplished by electric dipole interaction between the electric field of a grid and an induced dipole, and/or an electret dipole, to align them consecutively or concurrently without the need for expensive, bulky, and heavy motors. Thus the improved solar concentrator of the instant invention can be less expensive, more reliable, and lighter in weight than conventional solar concentrators.

FIG. 1A is a front cross-sectional view of an inverted rectangular optical element 1 that consists of a planar or convex lens 2 suspended from a top universal swivel 9 that can rotate or tilt in any direction, supported by a swivel bearing 8. This is one member of an adjustable Fresnel lens solar concentrator array. The advantage of overhead suspension with the swivel and bearing above the center of mass of each element is that it provides natural vertical stability to said optical elements. An Induced Electric Dipole and/or a permanent electric dipole (electret) interaction between a lens and a control grid achieves Alignment.

Non-transparent materials of high dielectric constant can be incorporated as thin strips of each lens 2 to aid in alignment, while blocking only a small fraction of the incident light. For example this could be along the vertical edges of the lens 2 in this figure. Even high dielectric constant liquids can easily be encapsulated in a hollow lens 2 that is sealed off after it is filled with the liquid.

FIG. 1B is a front cross-sectional view of an inverted circular optical element 1 composed of a planar or convex mirror 2 suspended from a universal pivot (swivel) 9 that can rotate or tilt in any direction, supported by a swivel bearing 8. This is one member of an adjustable Fresnel lens solar concentrator array. An Induced Electric Dipole and/or a permanent electric dipole (electret) interaction between a lens and a control grid achieves Alignment.

FIG. 1C is a front cross-sectional view of a circular lens 2, supported by a stem 3 attached to a side universal pivot 9 in a swivel bearing 8. This is one member of an adjustable Fresnel lens solar concentrator array. An Induced Electric Dipole and/or a permanent electric dipole (electret) interaction between a lens and a control grid achieves Alignment.

FIG. 2A is a cross-sectional side view of an inverted optical element 1 composed of a planar or convex lens 2 attached to a stem 3, that is suspended from a top universal swivel 9 in a swivel bearing 8. This is one optical element 1 of an adjustable Fresnel lens concentrator. The lens 2 is made of a high dielectric constant material, such as glass or plastic consistent with the need for it to be transparent, both to increase the dipole interaction and to increase the focusing ability. The mirror and dielectrics have been polarized as indicated by the + and − signs, and aligned by the applied electric field E. An electret (which is the electrostatic analogue of a magnet) can be part of the lens to further enhance the net dipole field. The optical element 1 is immersed in a transparent lubricating fluid 18 such as vacuum, oil, elevated pressure gas, etc.

FIG. 2B is a cross-sectional side view of an optical element 1 composed of a planar or convex lens 2 attached to a stem 3, that is supported by a bottom universal swivel 9 in a swivel bearing 8. This is one optical element 1 of an adjustable Fresnel lens concentrator. The lens 2 is made of a high dielectric constant material, such as glass or plastic consistent with the need for it to be transparent, both to increase the dipole interaction and to increase the focusing ability. High dielectric constant liquids can easily be encapsulated in a hollow lens 2 to increase the dipole interaction and enhance the alignment torque. The mirror and dielectrics are polarized, and aligned by the applied electric field E. An electret can be part of the lens to further enhance the net dipole field. The optical element 1 is immersed in a transparent lubricating fluid 18 such as vacuum, oil, elevated pressure gas, etc., which is contained by a transparent cover 45.

An array of such lenses 2 can be in air without the covering protection of a transparent sheet 45. However the covering protection of a transparent sheet 45 is preferable as is the fluid 18 (or vacuum). The fluid 18 serves as lubricant and corrosion resistant medium. The fluid 18 is also preferable to increase the dielectric strength. A contained fluid 18 with high dielectric strength and low dielectric constant is preferable. A positive feedback loop can be utilized to optimize the tracking and focusing of the solar concentrator lens array when there is a large mismatch between the index of refraction (or equivalently the dielectric constant) of the fluid 18 and that of the lens 2.

FIG. 3A is a front cross-sectional view of a rectangular planar or convex lens 2 supported by gimbals 7, attached to a stem 3 mounted on a pivot 9 that is supported by a bearing 8. This is one member of an adjustable Fresnel lens solar concentrator array. Non-transparent materials of high dielectric constant can be incorporated as thin strips of each lens 2 to aid in alignment, while blocking only a small fraction of the incident light. For example this could be along the vertical edges of the lens 2 in this figure. Even high dielectric constant liquids can easily be encapsulated in a hollow lens 2 to enhance the alignment torque.

FIG. 3B is a front cross-sectional view of a circular planar or convex lens 2 supported by gimbals 7, attached to a stem 3 mounted on a pivot 9 that is supported by a bearing 8. A dielectric strip (or layer) 2' is attached to the lens 2. This is one member of an adjustable Fresnel lens solar concentrator array.

Figure 4A:
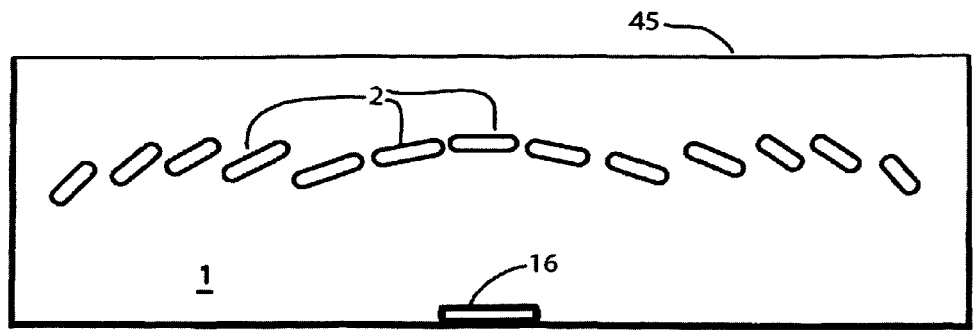
FIG. 4A is a cross-sectional side view of an array of rotatable lenses supported by universal pivots, immersed in a fluid, focusing incident light onto a receiver.

FIG. 4A is a cross-sectional side view portion of an array of optical elements 1 composed of planar or convex rotatable lenses 2 (supported by universal pivots that are not shown in this figure), covered by a transparent sheet 45, focusing incident light onto a receiver 16. High dielectric constant liquids can easily be encapsulated in a hollow lens 2 to increase the dipole interaction and enhance the alignment torque.

The entire array of optical elements 1 may be immersed in a transparent lubricating fluid as described in conjunction with FIGS. 2A and 2B, or simply be in air. The receiver 16 is shown inside the vessel containing the array of lenses 2, as this protects the receiver; however the receiver 16 may be outside the vessel. The array of lenses 2 has circular or quasi-circular symmetry as seen from above the array, for focusing on a relatively small receiver 16. As seen from above, the array of lenses 2 may have an outer perimeter that is circular, square, rectangular, etc. When the receiver 16 is a thin rectangle, the array of lenses 2 has a line symmetry whose axis corresponds to that of the receiver.

Figure 4B:
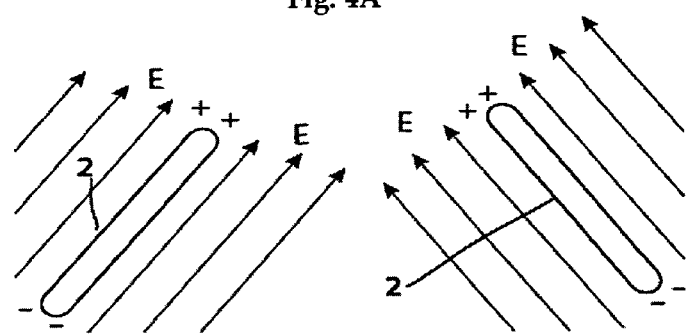
FIG. 4B is a cross-sectional side view of two of the rotatable lenses, at opposite sides of the axis of symmetry, of the array of lenses shown in FIG. 4A. These two lenses have been polarized and aligned by each separately applied electric field E.

FIG. 4B is a cross-sectional side view of two of the rotatable lenses 2, at opposite sides of the axis of symmetry, of the array of lenses shown in FIG. 4A. These two lenses 2 are polarized as indicated by the + and − charges at their ends, and aligned by each applied electric field E.

Figure 5A:
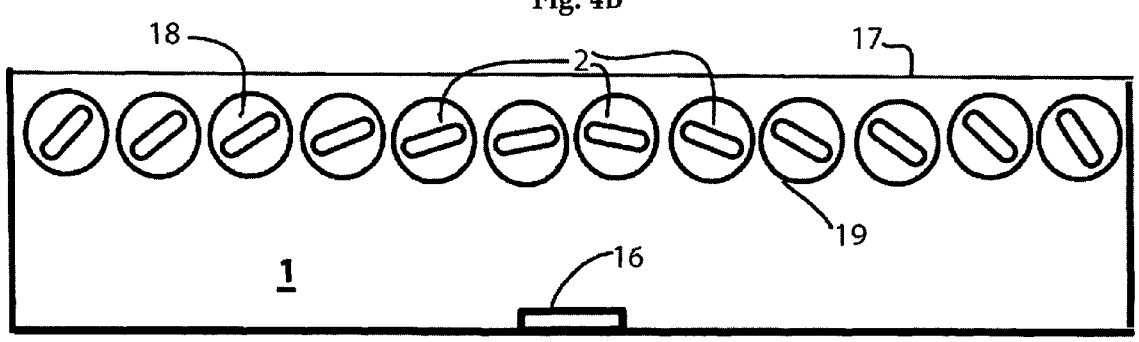
FIG. 5A is a cross-sectional side view of an array of rotatable lenses encapsulated inside lubricated cavities in a transparent sheet. These lenses internal-swivel in rotation so they can focus incident light onto a receiver.

FIG. 5A is a cross-sectional side view of an array of optical elements 1, containing rotatable lenses 2 and lubricant 18 encapsulated inside cavities 19 in a transparent sheet 17. These lenses internal-swivel in rotation so they can focus incident light onto a receiver 16. The receiver 16 is shown inside the sheet 17, as this protects the receiver; however the receiver 16 may be external to the vessel. The array of lenses 2 has circular or quasi-circular symmetry as seen from above the array, for focusing on a relatively small receiver 16. As seen from above, the array of lens 2 may have an outer perimeter that is circular, square, rectangular, etc. When the receiver 16 is a thin rectangle, the array of lens 2 has a line symmetry whose axis corresponds to that of the receiver.

Figure 5B:
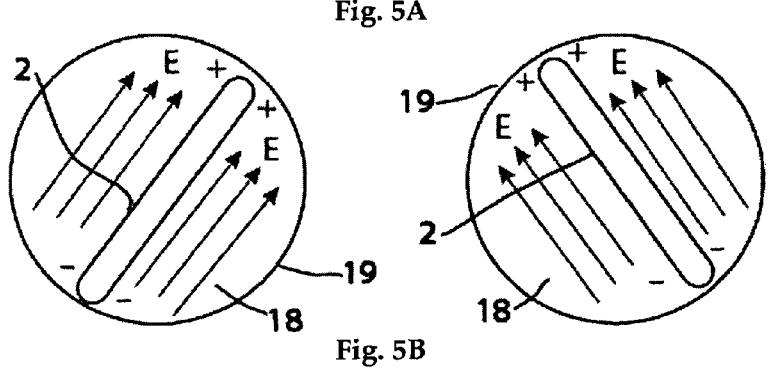
FIG. 5B is a cross-sectional side view of two of the rotatable lenses inside lubricated cavities, at opposite sides of the axis of symmetry, of the array of lenses shown in FIG. 5A. These two lenses have been polarized and aligned by each applied electric field E. The torque interaction of the electric dipole moment of the lenses 2 and the electric field E acts to align the lenses 2 parallel to the electric field E as shown here and in FIGS. 2A, 2B, and 4B. The torque is proportional to the vector product of E and the dipole moment of the lens.

FIG. 5B is a cross-sectional side view of two of the rotatable lenses 2 and lubricant 18, inside cavities 19. The lenses 2 are at opposite sides of the axis of symmetry, of the array of lenses shown in FIG. 5A. These two lenses 2 are polarized as indicated by the + and − charges at their ends, and aligned by the applied electric field E.

FIG. 6A represents a top view of an array of grid compartments with grid spacing L showing in detail a top view of one such top grid compartment 5t and the voltages at its four corners V1, V2, V1' and V2'. Each grid electrode is made of a highly resistive thin conductor.

FIG. 6B represents a bottom view of an array of grid compartments delineated by highly resistive electrodes with grid spacing L showing in detail a view of a bottom grid compartment 5b and the voltages at its four corners V3, V4, V3' and V4'.

FIG. 6C is a cut-away perspective of a schematic electronic control grid showing a transparent sheet 45 on top of the grid. The sheet 45 performs at least three functions. When the lenses are suspended, the primary function of the transparent sheet 45 is to house the swivel bearings 8 shown in FIGS. 1A, 1B, 2A, 2B, 3A and 3B, which in turn support the universal swivels 9. The bearings 8 and swivels 9 are not shown in this FIG. 4d to keep this figure uncluttered in showing just the voltage carrying electronic grid 44, and the transparent sheet 45; and because this configuration also applies to the internal-swivel embodiments. The sheet 45 also protects the optical elements (lenses etc.) and permits an uninterrupted duty cycle of the concentrator, so that the fully transparent sheet can be cleaned when it becomes grimy, while the lenses continue to perform their duty. If a fluid is used, for example, to increase the dielectric strength (breakdown voltage), the sheet 45 also functions to seal in the fluid such as vacuum, oil, elevated pressure gas, etc.

If the fluid is a gas such as air, when the grid gap is small or comparable to the electron mean free path in the ambient gas, then from an electrical breakdown point of view the pivoted lenses operate effectively as if they were in vacuum. In this case operation at atmospheric pressure, is much the same as operation in vacuum. Air at standard temperature and 1 atmosphere pressure has a number density of molecules of $n \sim 3 \times 10^{19}$ molecules/cm$^3$. The average spacing between molecules is $n^{-1/3} \sim 3 \times 10^{-7}$ cm=30 Å. The mean free path of molecules is $\sim 10^{-5}$ cm=1000 Å. The mean free path of electrons can be much higher than this.

FIG. 6D is a schematic top view showing an electronic control grid with resistive grid wires 24 for matrix addressing and alignment of the optical elements of a solar concentrator or other similar optical equipment. Also shown schematically are the swivel bearings 8 which support the swivels (described earlier with swivels designated as 9), when the lenses are suspended. The term "equipment" is used in the instant invention to stand for Solar Energy Concentrators which may be of the Fresnel lens type, or other types and equipment requiring addressing and alignment, such as other concentrators, and display equipment. This grid can be laid on the bottom of the equipment, on the top and bottom of the equipment, on the top of the equipment with a ground plane on the bottom of the equipment, etc. In order to avoid having several similar looking figures, this schematic may be thought of as a representation of any one of several addressing grid arrays.

The control grid may be a wire grid array with one set of parallel wires on top of the equipment, separated and insulated from an orthogonal set of wires (that are parallel to each other) on the bottom of of the equipment. It may be an actual interconnected grid with Thin Film Transistors (TFTs), tunneling junction transistors (as used in flash memories), or similar devices at each of the grid junctions. In this case it is preferable to use Polymer based transistors for flexibility. The grid 33 may be a segmented array with each square being a separate insulated slab (cf. to U.S. Pat. No. 6,964,486). In this case, the horizontal and vertical lines shown in FIG. 1 represent insulation between adjacent segments or slabs. The common element of all of these embodiments is the ability to impress the voltage $V_{ij}$ at the ij th node either statically or by means of a traveling wave. To minimize power dissipation, it is desirable to make the grid electrodes (edges that delineate the grid compartments such as 5t and 5b of FIGS. 6A and 6B) highly resistive so that a given voltage drop is accomplished with a minimum of current flow and hence with a minimum of power dissipation. The bus bars that bring the voltage to the grid electrodes may have a higher conductivity (lower resistance). A processor sends signals via bus bars to establish voltages from a power supply to each corner of a grid compartment (cf. FIGS. 6A and 6B) whose edges are grid electrodes made of a highly resistive thin conductor.

FIG. 7 is a block diagram flow chart summarizing a method in which a positive feedback loop can optimize the tracking and focusing of the solar concentrator array of lenses. As discussed in U.S. Pat. No. 6,988,809 (Rabinowitz, Jan. 24, 2006), an approximate alignment (orientation) calibration may be done at the factory using GPS (Global Positioning Satellite) input related to the final placement site and orientation, with in-situ fine tuning at the installation location. Positive feedback optimization can only work when there is an initial signal to guide the feedback process by means of a digital processor.

Preferably with the sun overhead on a clear day, the orientation of the elements (lenses, etc.) can be adjusted to maximize the power output of the receiver 16. For example an optimizing sensor such as a photomultiplier can be attached to the receiver, and used to increase sensitivity to the reflected light signal by means of positive feedback. On cloudy days, the optimizing sensor or just the receiver can be used to find that orientation of the lenses that maximizes the output of receiver 16. This orientation may be away from the sun, and point toward the most reflective cloud. The elements may be individually oriented, or groups of lenses may be collectively oriented to simplify tracking and focusing. When groups are collectively oriented, as a group they may have a projected group convexity to aid in the focusing to the receiver.

An optimizing sensor can direct the steps shown in the block diagram flow chart of FIG. 7. A given lens is actuated by dipole interaction with the control grid to adjust the alignment of the selected lens in a first angular direction. If the signal from the optimizing sensor (photomultiplier) increases in response to the change, the lens 2 is again adjusted in the same angular direction. This process is continued until a slight decrease is perceived. Then the lens is adjusted in the opposite direction, increasing the signal back to its prior value. Now smaller steps are taken back and forth until a maximum signal is obtained. This process is then repeated in additional angular directions until the alignment of a lens is optimized. This process is then continued element by element until all the elements are optimized in their alignment. Computer readable memory stores the location of each element. Alternatively, groups of elements can be similarly optimized in their alignment as a whole.

DISCUSSION

Now that the instant invention has been described and the reader has a reasonable understanding of it, we can more clearly discuss its advantages with respect to other possible concentrator alignment mechanisms.

1. One of the most important advantages of the invention is related to ease of calibration, and response speed in producing a given desired motion or deflection by means of the preferred induced and/or permanent electric dipole interaction with the electric fields of the control grid. For the same applied force, electromagnetic systems are inherently slower in responding to an input signal because of self-inductance and mutual-inductance effects. Magnetic systems are inherently slower because of the time the magnetic field takes to diffuse into a conducting medium after it is applied. Furthermore, it would be unwieldy to put motors on each element (lens) of an array.

To have only one or a few motors accomplish alignment of an array by mechanical coupling means such as long rods, gears, turnbuckles, etc. would be a slow, cumbersome, and painstaking process. In a cloudless sky, speed of alignment may not be critical for a solar concentrator, due to the slowly changing position of the sun relative to the earth. However with fast moving clouds, speed can be a decisive factor. Even in a cloudless sky, speed of alignment becomes more critical at high concentration factors.

2. The power requirements to produce a given desired alignment by means of an induced and/or permanent electric dipole interaction with the electric fields of the control grid mechanisms of the instant invention are moderate. The power consumption is small in comparison with electromagnetic motors.

3. Electromagnets in general and electromagnetic motors in particular become quite inefficient as they are scaled down to the mini or micro size range. The present invention is more amenable to miniaturization such as required in nanotechnology.

4. Since the torque on lens diminishes as the lens aligns itself with the electric field, the system of lens operates close to that of a critically damped system with little or no overshoot.

SCOPE OF THE INVENTION

While the instant invention has been described with reference to presently preferred and other embodiments, the descriptions are illustrative of the invention and are not to be construed as limiting the invention. Thus, various modifications and applications may occur to those skilled in the art without departing from the true spirit and scope of the invention as summarized by the appended claims together with their full range of equivalents. It is to be understood that in said claims, ingredients recited in the singular are intended to include compatible combinations of such ingredients wherever the sense permits. It should be recognized that the methods and apparatus of this invention can be used in other contexts than those explicitly described herein. It is also to be understood that the following claims are intended to cover all of the generic and specific features of the invention herein described, and all statements of the scope of the invention which, as a matter of language, might be said to fall there between.

The invention claimed is:

1. A solar concentrator system comprising:
 a) an array of adjustable optical lenses;
 b) said lenses mounted on at least one pivot;
 c) said lenses coupled to an electronic control grid;
 d) a polarizable dielectric strip attached to at least one of said lenses;
 e) said dielectric strip having a dielectric constant greater than 3;
 f) dipole linkage with said control grid to rotate said lenses, wherein polarization of said dielectric strip produces said dipole linkage; and
 g) a receiver for energy conversion of the concentrated light.

2. The apparatus of claim 1, wherein said dipole is induced.

3. The apparatus of claim 1, wherein said pivot is at least one gimbal.

4. The apparatus of claim 1, wherein said lenses contain at least one electret.

5. The apparatus of claim 1, further comprising a positive feedback loop comprising circuitry to control the operation of said control grid wherein said feedback loop optimizes the alignment of said lenses.

6. The apparatus of claim 1, wherein each of said lenses are supported by at least one pivot point consisting of the group with a pivot point above the lens, with a pivot point internal to the lens, with a pivot point to the side of the lens, and with a pivot point below the lens.

7. The apparatus of claim 1, wherein said lenses are contained in a fluid consisting of at least one of the group of vacuum, oil, and gas.

8. The apparatus of claim 1, wherein said lenses consist of at least one of the group of planar and convex lenses.

9. The apparatus of claim 1, wherein said lenses are covered by a transparent sheet.

10. A concentrator apparatus comprising:
a) an array of adjustable lenses;
b) said lenses mounted on at least one pivot;
c) said lenses coupled to an electronic control grid;
d) said control grid activated by a digital processor;
e) polarizable dielectric layer attached to at least one of said lenses;
f) said dielectric layer having a dielectric constant greater than 3; and
g) dipole linkage with said control grid to rotate said lenses, wherein polarization of said dielectric layer produces said dipole linkage to rotate said lenses.

11. The apparatus of claim 10, wherein each of said lenses are supported by at least one pivot point consisting of the group with a pivot point above the lens, with a pivot point internal to the lens, with a pivot point to the side of the lens, and with a pivot point below the lens.

12. The apparatus of claim 10, wherein said lenses are contained in a fluid consisting of at least one of the group of vacuum, oil, and gas.

13. The apparatus of claim 10, wherein said lenses consist of at least one of the group of planar and convex lenses.

14. The apparatus of claim 10, wherein said lenses are covered by a transparent sheet.

15. The apparatus of claim 10, further comprising a positive feedback loop comprising circuitry to control the operation of said control grid wherein said feedback loop optimizes the alignment of said lenses.

16. The apparatus of claim 10, wherein said lenses contain at least one electret.

* * * * *